US008587931B2

(12) United States Patent
Shiraiwa et al.

(10) Patent No.: US 8,587,931 B2
(45) Date of Patent: Nov. 19, 2013

(54) JUNCTION BLOCK

(75) Inventors: Hiroki Shiraiwa, Shizuoka (JP);
Kazuomi Kiyosue, Shizuoka (JP);
Akinori Nakashima, Shizuoka (JP);
Tomohiro Sugiura, Shizuoka (JP);
Noriyoshi Yamazaki, Shizuoka (JP);
Minoru Umezaki, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 359 days.

(21) Appl. No.: 12/735,195

(22) PCT Filed: Dec. 12, 2008

(86) PCT No.: PCT/JP2008/072658
§ 371 (c)(1),
(2), (4) Date: Oct. 12, 2010

(87) PCT Pub. No.: WO2009/081767
PCT Pub. Date: Jul. 2, 2009

(65) Prior Publication Data
US 2011/0043969 A1      Feb. 24, 2011

(30) Foreign Application Priority Data
Dec. 21, 2007    (JP) ................................ 2007-329989

(51) Int. Cl.
*H02G 3/08*       (2006.01)
(52) U.S. Cl.
USPC ............................ 361/630; 361/624; 361/752
(58) Field of Classification Search
USPC ................. 361/624, 630, 752; 174/68.2, 252
See application file for complete search history.

(56) References Cited

U.S. PATENT DOCUMENTS

| 5,823,819 | A | 10/1998 | Kondo et al. |
| 5,928,004 | A * | 7/1999 | Sumida et al. ............... 439/76.2 |
| 6,396,380 | B1 * | 5/2002 | Girke et al. ................... 337/189 |
| 6,430,054 | B1 | 8/2002 | Iwata |
| 6,509,824 | B2 * | 1/2003 | Inaba et al. ................... 337/295 |
| 6,724,627 | B2 * | 4/2004 | Onizuka et al. ............... 361/704 |

(Continued)

FOREIGN PATENT DOCUMENTS

| EP | 1530411 A1 | 5/2005 |
| EP | 1674346 A2 | 6/2006 |

(Continued)

OTHER PUBLICATIONS

Notification of Reason for Refusal issued on Jun. 26, 2012 for corresponding Japanese Application No. 2007-329989 with English translationl.

(Continued)

*Primary Examiner* — Anatoly Vortman
(74) *Attorney, Agent, or Firm* — Edwards Wildman Palmer LLP (57) ABSTRACT

The present invention provides a junction block adapted adaptable for a variety of vehicles without increase of cost. The junction block includes a circuit board 2, a terminal block 3 for low-grade use to be connected to the circuit board, a bus bar block 4 superimposed on the terminal block and connected to the circuit board, a cover 9 for covering the circuit board from side of the bus bar block, and a plurality of fuses 39,39' to be connected to terminals 14a, 19a of the terminal block and the bus bar block, wherein the junction block is adaptable for a variety of vehicles with or without use of the bus bar block.

18 Claims, 8 Drawing Sheets

(56) References Cited

U.S. PATENT DOCUMENTS

| | | | |
|---|---|---|---|
| 6,753,754 B1 * | 6/2004 | Black et al. | 337/215 |
| 6,891,463 B2 * | 5/2005 | Nagaoka | 337/187 |
| 7,470,130 B2 | 12/2008 | Kubota et al. | |
| 7,504,926 B2 * | 3/2009 | Bessho et al. | 337/283 |
| 7,592,892 B2 * | 9/2009 | Ito et al. | 337/159 |
| 7,612,646 B2 * | 11/2009 | Kubota | 337/186 |
| 7,612,647 B2 * | 11/2009 | Onoda et al. | 337/229 |
| 7,616,438 B2 * | 11/2009 | Shimizu et al. | 361/694 |
| 8,207,454 B2 * | 6/2012 | Darr et al. | 174/520 |
| 2002/0157847 A1 | 10/2002 | Chiriku et al. | |
| 2004/0004818 A1 | 1/2004 | Kawakita et al. | |
| 2004/0029419 A1 | 2/2004 | Uezono | |
| 2004/0223304 A1 | 11/2004 | Kobayashi et al. | |
| 2006/0141822 A1 * | 6/2006 | Ozawa et al. | 439/76.1 |
| 2009/0191728 A1 * | 7/2009 | Kubota et al. | 439/76.2 |
| 2010/0263915 A1 * | 10/2010 | Shiraiwa et al. | 174/252 |

FOREIGN PATENT DOCUMENTS

| | | |
|---|---|---|
| EP | 1674346 A3 | 6/2006 |
| JP | 55-12728 | 1/1980 |
| JP | 1-166417 | 11/1989 |
| JP | 09-092987 A | 4/1997 |
| JP | 09-312919 A | 12/1997 |
| JP | 10-285750 A | 10/1998 |
| JP | 2006-006069 A | 1/2006 |
| JP | 2006-333583 A | 12/2006 |
| JP | 2007-228757 A | 9/2007 |

OTHER PUBLICATIONS

Supplementary European Search Report dated Feb. 7, 2012, issued for the European patent application No. 08864227.7.

International Search Report dated Mar. 10, 2009, issued on PCT/JP2008/072658.

Australian Patent Examination Report No. 1 issued on Dec. 11, 2012 for corresponding Australian Application No. 2008341974.

Office Action dated Aug. 31, 2012, issued for the corresponding Canadian patent application No. 2 709 788.

Chinese Notification of the First Office Action issued on Oct. 25, 2012 for corresponding Chinese Application No. 200880126358.1.

* cited by examiner

JUNCTION BLOCK

TECHNICAL FIELD

The present invention relates a junction block commonly adaptable for a variety of vehicles.

RELATED ART

Figure 14:
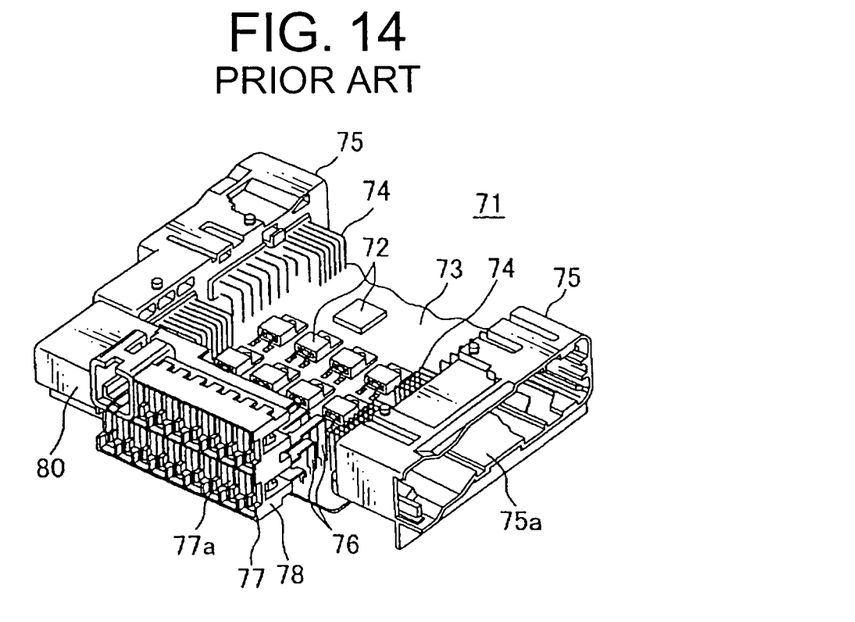
FIG. 14 is an essential perspective view of an embodiment of a conventional junction block.

FIG. 14 shows one embodiment of a conventional junction block (refer to Patent Document 1).

The junction block 71 includes a circuit board 73 mounting a variety of electronic components 72, connector blocks 75 disposed on the right and left side of the circuit board 73 and connected with terminals 74 to the circuit board 73, and fuse block 77 disposed on a front side of the circuit board 73 and connected with terminals 76. he circuit board 73 and the blocks 75, 77 are covered with an upper and a lower cover (not shown) while opening portions 75a, 77a of the respective blocks 75, 77 are exposed.

The connector blocks 75 each include a connector housing 75 (the same reference numeral is used) made of an insulation resin and the substantially L-shaped terminals 74. One end of each terminal 74 is fitted into the connector housing and the other end thereof is solder-connected to the circuit board 73. The fuse block 77 includes the substantially L-shaped terminals 76, each one end thereof being fitted into a fuse holder 78 (block main body) made of an insulation resin and the other end thereof being solder-connected to the circuit board 73, bus bars (not shown) each having a comb shape, being made from a conductive metal and fitted into the fuse holder 78, and a connector 80 receiving one side of the each bus bar for supplying electrical power.

The fuse holder 78 receives a plurality of blade type fuses (not shown) arranged in an upper and a lower layer and extending parallel to right and left. The respective fork-shaped terminals (pinch terminals) of a pair of the upper and the lower terminal 76 and a pair of the upper and the lower bus bar are fitted into the upper and the lower receiving chambers 77a corresponding to the pair of the upper and the lower terminal of the fuse. The connector 80 is connected with the battery or an alternator power.

Patent Document 1 also discloses a terminal holder (not shown) connected to the fuse holder 78 and receiving L-shaped terminals 76 in the respective layers instead of the bus bars described above. A copper core layer (not shown) is disposed midway in the thickness of the circuit board 73.
Patent Document 1: JP 2006-333583 (FIG. 6 and FIGS. 1-2).

The conventional junction block 71 has a drawback for increase of power supply circuits required depending on the vehicles. The different configurations adapted for the respective vehicles require new designs with a different number of layers of the fuse block 77, resulting in increase of cost.

As the number of the layers of the fuse block 77 increases, assembly efficiency of the fuse block 77 to the circuit board 73 or the cover decreases. The fuse block (fuse holder 78) is easily subjected to deformation due to heat of soldering for connecting the terminals 76 to the circuit board 73. It is thus necessary to use the fuse holder 78 having a high heat resistance to prevent the deformation. The fuse holder 78 with many layers results in high cost. The conventional junction block has a concern that when the fuse is inserted into a fuse connection terminal, the terminal is subjected to a strong press force in an insertion direction which have a deleterious effect on the solder connection portion of the circuit board 73, especially when a plurality of the fuses are inserted into a plurality of the fuse connection terminals having a single terminal.

DISCLOSURE OF THE INVENTION

The present invention is to provide a junction block without increase of cost caused by grades of vehicles. The junction block of the present invention improves an assembly of a fuse block, prevents a thermal influence to the fuse block with low cost, and prevents deleterious effect on a board connection portion of a terminal when the fuse is inserted.

According to a first aspect of the present invention, a junction block includes a circuit board; a terminal block to be connected to the circuit board; a bus bar block capable of being superposed on the terminal block and being connected to the circuit board; a cover for covering the circuit board from side of the bus bar block; and a plurality of fuses to be connected to terminal portions of the terminal block and the bus bar block, wherein the junction block is adaptable for a variety of vehicles with or without use of the bus bar block.

Thereby, the low-grade vehicle has the junction block without mounting the bus bar block. The high-grade vehicle has the junction block mounting the bus bar block and utilizes other common parts. The bus bar block includes a block main body made of an insulation resin and the bus bar. The bus bar mainly works as a power supply bus bar and is connected to a conductive metal core layer or a print circuit of the circuit board. The terminal block includes an insulation block main body and a terminal. The bus bar or the terminal has the terminal portions to be connected to a fuse and the circuit board.

Preferably, the bus bar block has a block main body having a hole, the cover having a pin engaging the hole, the circuit board having a small hole allowing the pin to be screwed with a screw member.

Thereby, the bus bar block is positioned to the cover with the pin. The circuit board is positioned and fixed to the pin with the screw and the bus bar is also positioned. Thus, the terminal portions of the bus bar block are properly positioned to the hole of the circuit board, smoothly inserted to the hole of the circuit board, and solder-connected to the circuit board. A base portion is utilized for positioning the bus bar block and minimizing the junction block.

Preferably, the block main body of the terminal block is made of a high-heat resistance resin and the block main body of the bus bar block is made of a low-heat resistance resin.

Thereby, the block main body of the bus bar block is disposed on the terminal block adjacent the circuit board. The thermal influence during solder connection between the circuit board and the bus bar or the terminal block is not transferred to the bus bar block main body. The low heat resistance resin is thus utilized.

Preferably, the cover has a rib for allowing abutment of a rear surface of a bent portion of the bus bar of the bus bar block and accepting an insertion force of the fuse.

When the fuse is inserted into a terminal of the bus bar, the bus bar is usually pushed toward insertion direction. The abutment of the bus bar on the rib of the cover permits the rib to accept the push force and prevents transfer of the force to a connection portion (solder portion) between the bus bar and the circuit board and an excess load of stress on a soldered portion.

Preferably, the rib has stepwise a low projection portion and a high projection portion, the low projection portion supporting the bus bar, and the high projection portion abutting the rear surface of the bent portion.

Thereby, the low projection portion of the rib horizontally supports the bus bar and prevents bending (flexure) of the bus bar in the thickness direction. The high projection portion of the rib abuts a vertical rear surface of the bus bar and accepts the force of the bus bar in the insertion direction of the fuse (horizontal direction).

Preferably, terminals of the terminal portions are inserted in and held with the block main body of the terminal block, the cover having a rib for allowing abutment of the rear surface of the block main body of the terminal block and accepting the insertion force of the fuse.

When the fuse is inserted into the terminal portion of the terminal for fuse connection, the terminal is pushed into the insertion direction of the fuse together with the terminal block main body. Thereby, the abutment of the terminal block main body on the rib of the cover allows the rib for accepting the insertion force, preventing the transmission of the force to the connection portion (soldered portion) between the terminal and the circuit board, and preventing load of the excess stress on the soldered portion.

BEST MODE FOR CARRYING OUT THE INVENTION

Figure 1:
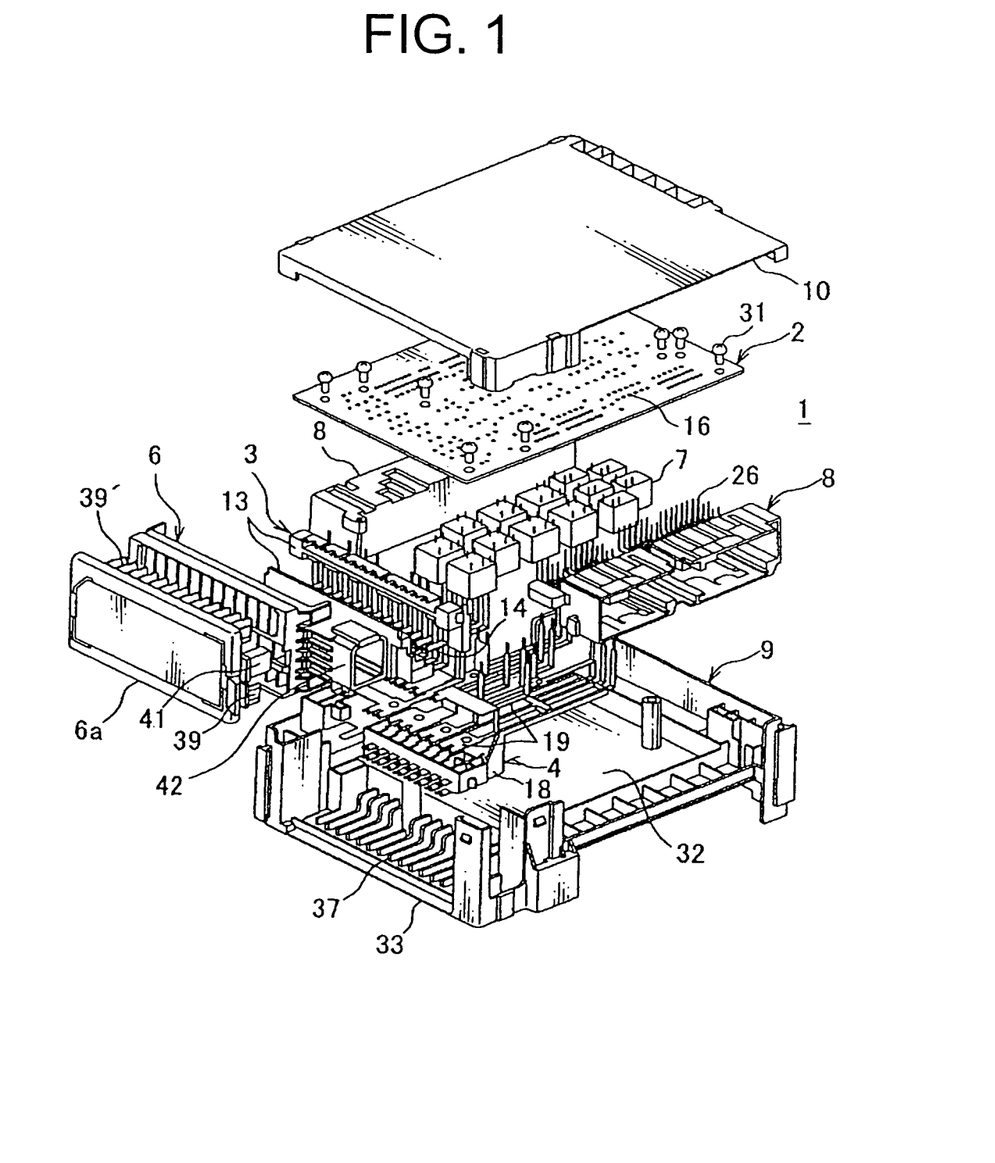
FIG. 1 is an exploded perspective view of an embodiment of a junction block of the present invention.

FIG. 1 shows an embodiment of a junction block of the present invention.

The junction block 1 includes a print circuit board 2 having a copper core layer midway of the thickness thereof, a terminal block 3 for low-grade vehicles connected to a front portion of the circuit board 2, a bus bar block 4 for high-grade use connected to a middle portion of the circuit board 2 in the longitudinal direction of thereof and superposed on the terminal block 3, a fuse holder 6 made of an insulation resin and attached to an assembly 5 (FIG. 3) of the terminal block 3 and the bus bar block 4, a plurality of relays 7 mounted on the circuit board 2, connector blocks 8 each disposed and connected to the right and the left side of the circuit board 2, an inner cover (cover) 9 made of an insulation resin supporting the terminal block 3, the bus bar block 4, the connector block 8 and the fuse holder 6, and an outer cover 10 made of an insulation resin and disposed opposite the inner cover 9 for supporting the circuit board 2.

FIG. 1 shows that the terminal block 3 is disposed over the bus bar block 4 and the circuit board 2 is disposed over the terminal block 3. The turnover arrangement is also allowable.

An electronic control unit (not shown) is disposed under the inner cover 9 in FIG. 1 and a connector portion 11 (FIG. 5) connected to the electronic control unit is disposed on a rear end portion of the circuit board 2. The inner cover 9 is fixed to a vehicle body with a separate bracket (not shown) and the fuse holder 6 has a cover 6a.

The directions described in the specification do not intend to specify the direction mounting the junction block 1. The specification mainly describes the turn-over arrangement of the junction box. The junction block 1 is also referred to junction box or electric connection box. The inner cover 9 and the outer cover 10 are also referred to as one cover and the other cover, respectively.

Figures 2A, 2B:
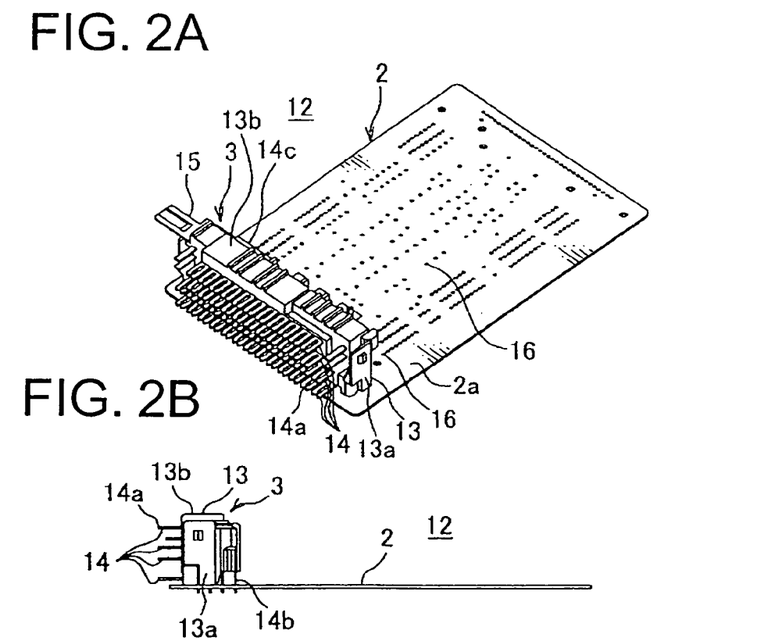
FIG. 2A is a perspective view of an embodiment of a circuit board assembly for low-grade vehicles.
FIG. 2B is a side view of the embodiment of the circuit board assembly for low-grade vehicles.

FIGS. 2A and 2B show a circuit board assembly 12 for low-grade vehicles.

The terminal block 3 includes a block main body (terminal holder) 13 made of an insulation resin, and substantially L-shaped terminals 14 disposed layer by layer (four layers in the embodiment) and parallel one another in the block main body 13. For example, the terminals 14 of the second layer and the third layer from the circuit board have the respective terminals with fork-shaped pinch terminals (terminal portion) 14a, and the forth layer has a wide terminal having a plurality of pinch terminals 14a. A tab terminal 15 for electrical power supply is formed integrally with the wide terminal.

The terminals 14 are each inserted into an elongated groove or hole (not shown) of the block main body 13 and a horizontal portion 14c adjacent a bent portion midway of the terminal 14 abuts a horizontal wall surface of the block main body 13. The terminals 14 may be molded integral with the block main body 13. The block main body 13 of the embodiment is constituted with two parts. The parts 13a, 13b are connected with an engaging means and the terminals 14 each are held between the upper part 13b and the lower part 13 a.

A bottom surface of the block main body 13 is connected to a surface 2a of the circuit board 2. Each pinch terminal portion (fuse connection portion) 14a of one side of the respective terminals 14 projects from a front end of the block main body 13. Each pin-shaped terminal 14b of the other side of the respective terminals 14 is inserted into a through-hole 16 of the circuit board 2 and connected to the print circuit (not shown) on both sides of the circuit board 2 or the copper core layer disposed midway of the circuit board 2. The tab terminal 15 for electric power supply projects from a side end of the block main body 13. The copper core layer is superimposed between the insulation boards.

Figures 3A, 3B:
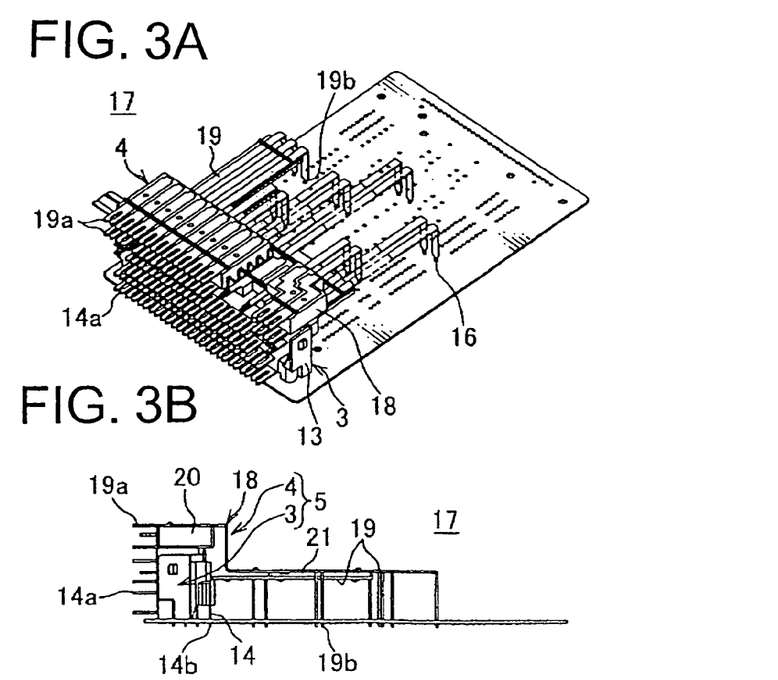
FIG. 3A is a perspective view of an embodiment of a circuit board assembly for high-grade vehicles.
FIG. 3B is a side view of the embodiment of the circuit board assembly for high-grade vehicles.

FIGS. 3A and 3B show a circuit board assembly 17 for high-grade vehicles. The circuit board assembly 17 has a configuration of the bus bar block 4 mounted on the low-grade vehicles circuit board assembly 12.

Figure 4:
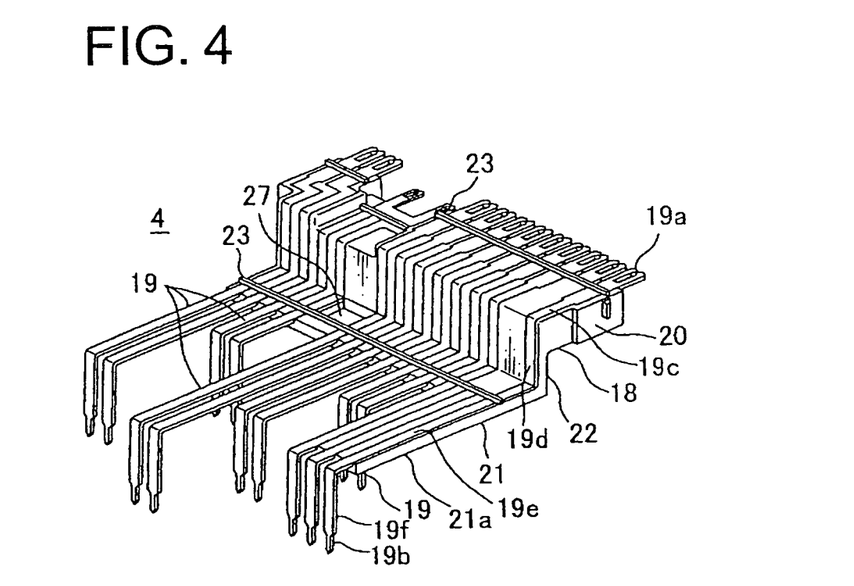
FIG. 4 is a perspective view of an embodiment of a bus bar block for high-grade vehicles.

As shown in FIG. 4, the bus bar block 4 includes a block main body 18 made of an insulation resin and having a crank-shaped step with a side view, and a plurality of power supply bus bars 19 disposed parallel in double layers on a top and a bottom surface of the block main body 18.

The block main body 18 includes a plate-shaped thick wall portion 20 at a forward side, a plate-shaped thin and horizontal lower layer wall portion 21, and a plate-shaped vertical wall portion 22 connecting the both wall portions 20, 21. The lower layer wall portion 21 extends along the bus bar 19 only by a portion 21a of the elongated upper and the lower bus bar 19. The lower layer bus bar 19 (the fifth layer) is short and the upper layer (sixth layer) bus bar 19 is long. The upper layer bus bars 19 have a variety of lengths and are arranged straight in the longitudinal direction of the circuit board 2 (FIG. 3). The terminals of each layer of the terminal block 3 are disposed on the first to the fourth layer.

The each bus bar 19 is bent along the block main body 18 in the crank shape. A front end portion thereof has a horizontal pinch terminal portion (terminal portion) 19a to be connected to the associated fuse and a rear end portion thereof has a vertical pin-shaped board connection terminal portion 19b. The each pinch terminal 19a extends in the order of a horizontal portion 19c, a vertical portion (bent portion) 19d, a horizontal portion 19e below the vertical portion 19d, a downward vertical portion 19f, and the board connection terminal portion 19b.

The board connection terminal portions 19b are mainly solder connected to the core layer midway of the circuit board 2 (FIG. 3) or the print circuit (not shown) of the circuit board 2. The core layer distributes the electrical power. In the embodiment, the upper layer bus bars 19 are insert formed on the block main body 18 and the lower layer bus bars 19 are fixed to the block main block 18 with a hot adhesion. The upper and the lower layer bus bars 19 are also fixed with insertion mold. The bus bars 19 are prevented from lifting from the block main body 18 with a transverse rib 23.

As shown in FIG. 3, the lower surface of the upper layer wall portion 20 of the bus bar block main body 18 for high-grade vehicles abuts on the upper surface of the upper part 13b of the low-grade vehicles terminal block main body 13. The terminal portions 19b of the bus bars 19 are solder fixed to the circuit board 2 and the upper part 13b of the terminal block main body 13 assures holding of the terminals 14.

Figure 5:
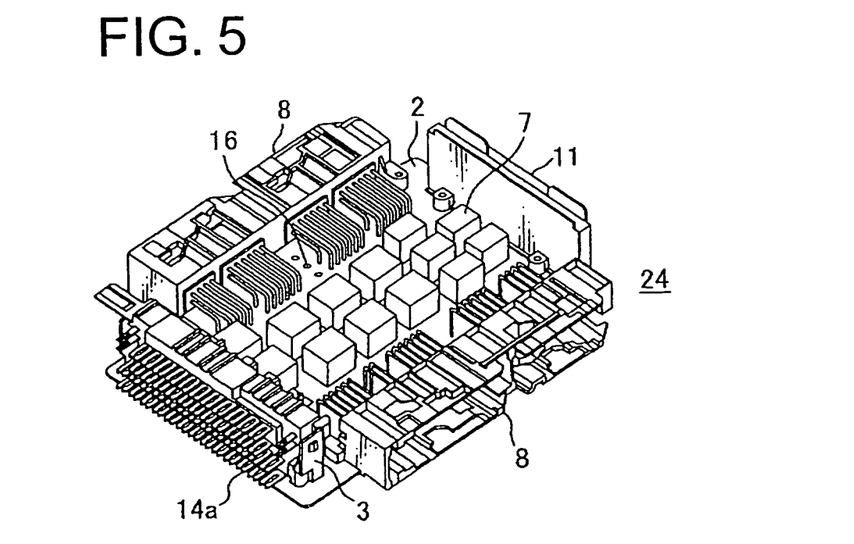
FIG. 5 is a perspective view of an embodiment of a circuit board assembly product for low-grade vehicles.
Figure 6:
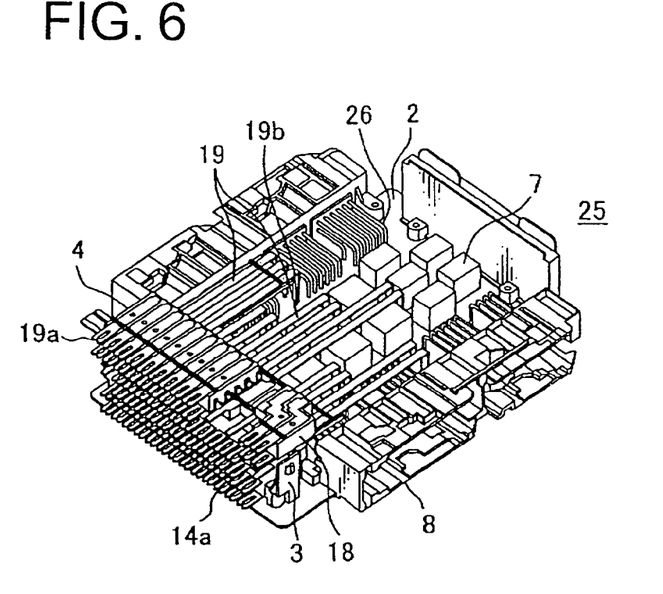
FIG. 6 is a perspective view of an embodiment of a circuit board assembly product for high-grade vehicles.

FIG. 5 shows a circuit board assembly product 24 having an essential portion of the junction block for low-grade vehicles. FIG. 6 shows a circuit board assembly product 25 having an essential portion of the junction block for high-grade vehicles.

As shown in FIG. 5, the circuit board assembly product 24 has the terminal block 3 at the front portion of the circuit board 2, the connector blocks 8 at both right and left side of the circuit board 2, the plurality of the relays 7 disposed between the connector blocks 8 and connected to the circuit board 2, and the connector portion 11 at the rear end portion of the circuit board 2 to be connected to the control unit.

As shown in FIG. 6, the bus bars 19 backwardly extending from the bus bar block 4 horizontally pass over the terminals 26 or the relays 7 of the connector block 8 and are connected to the holes 16 of the circuit board 2 between the terminal 26 and the relays 7.

In FIGS. 3A and 3B, the block main body 13 of the terminal block 3 is formed with a high-heat resistance synthetic resin and the block main body 18 of the bus bar block 4 is formed with a cheap low-heat resistance synthetic resin. Since the terminal block 3 directly contacts the circuit board 2 and is exposed to heat of solder, it is necessary to use the high-heat resistance resin. Since the bus bar block 4 is mounted on the terminal block 3 and is not affected by the heat, the low-heat resistance and low-price resin (for example PP) is adapted.

The example of the high-heat resistance resin is PPS, PSF, PES and the like well known as super engineering plastics.

Figure 7:
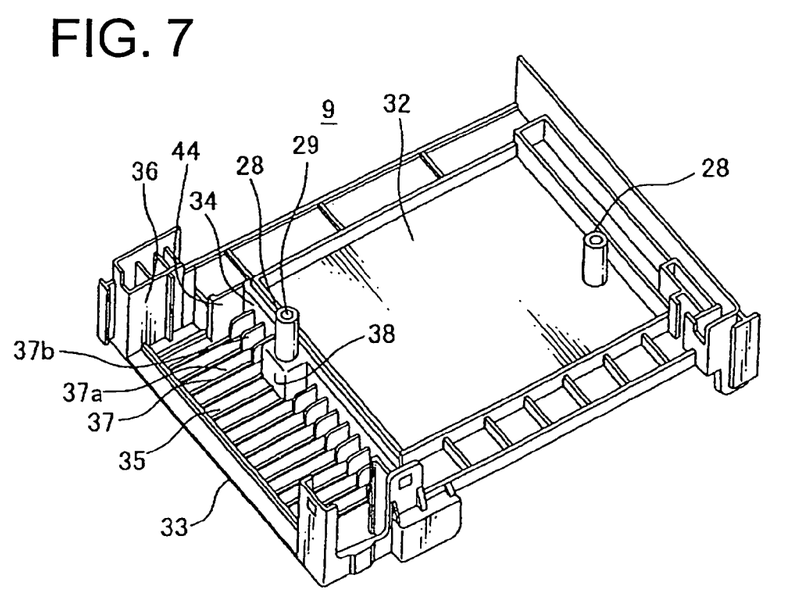
FIG. 7 is a perspective view of an embodiment of an inner cover.
Figure 8:
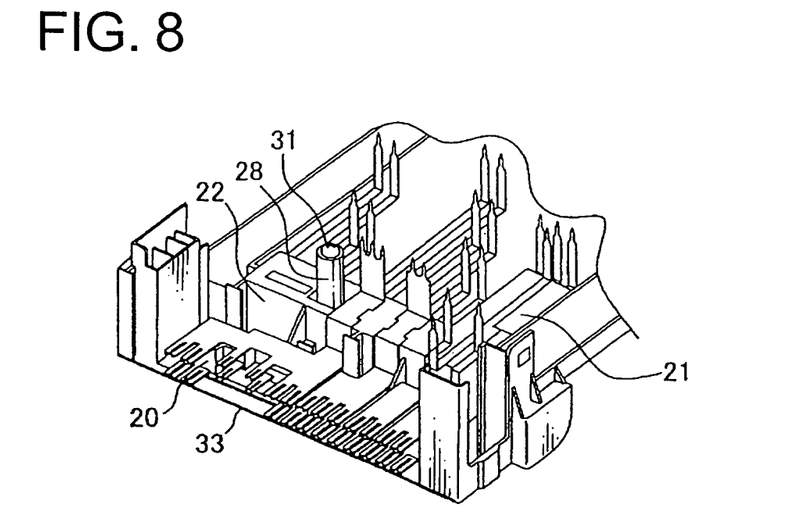
FIG. 8 is a perspective view of the inner cover having the bus bar block.

As shown in FIG. 4, the lower layer wall portion 21 of the block main body 18 of the bus bar block 4 has a rectangular hole 27, preferably square hole, between the bus bars 19 largely separated each other. As shown in FIG. 7, the inner cover 9 has a projecting pin 28 to be inserted into the hole 27. As shown in FIG. 8, insertion of the pin 28 into the hole 27 assures correct position of the bus bar block 4 with respect to the inner cover 9. An outer diameter of the pin 28 is slightly smaller than an inner width of the hole 27. The pin 28 projects from the lower wall portion 21 of the bus bar block 14 (FIG. 4) toward the projecting direction of the board connection terminal portion 19b.

Figure 9:
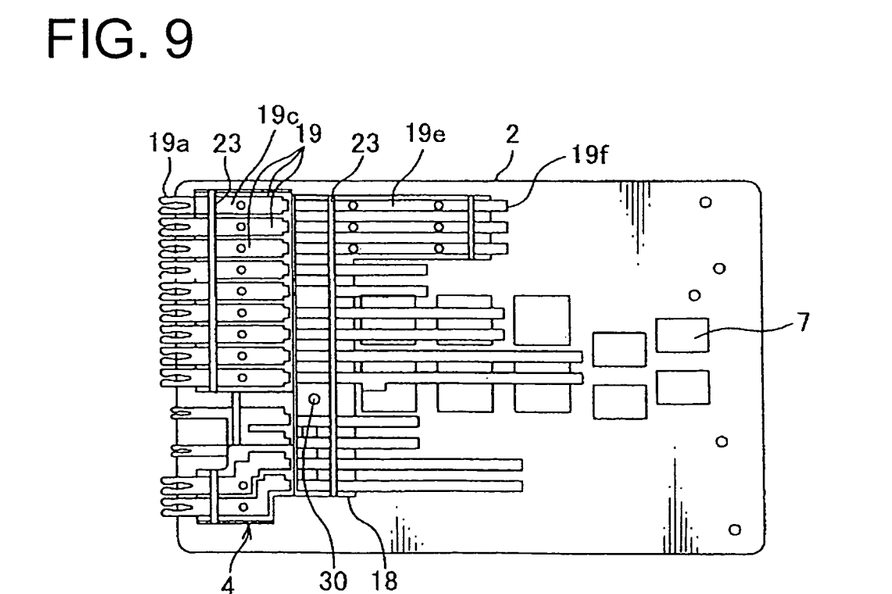
FIG. 9 is a plan view of the circuit board having the bus bar block.

The pin 18 has a female-screwed hole 29 at the distal end. As shown in FIG. 9, the circuit board 2 has a small hole 30 to accept a screw. The tip portion of the pin 28 supports the circuit board 2 with a screw 31 fixing the circuit board 2. The pin 28 is also disposed behind the inner cover 9.

In the embodiment shown FIG. 4, the bus bar block 4 has the single hole 27. It is preferable to dispose each hole between the adjacent bus bars 19 in order to cut an integral connection piece (not shown) connecting the bus bars 19. The hole 27 largest among the holes is adapted for positioning the circuit board.

As shown in FIG. 7, the inner cover 9 has an extending portion 33 fitting to the step shape of the bus bar block 4 (FIG. 4). The extending portion 32 is disposed on a forward end portion of a horizontal wide flat base portion 32. The upper wall portion 20 (FIG. 4) of the bus bar block 4 is positioned to the extending portion 33 and the lower wall portion 21 is positioned along the base portion 32.

The extending portion 33 includes a vertical wall portion 34 (FIG. 7) connected to the forward end of the base portion 32, horizontal short wall portions (second base portions) 35 connected to the vertical wall portion 34, and side wall portions 36 upstanding beside of the horizontal wall portions 35. The horizontal wall portions 35 receive a plurality of ribs 37 upstanding parallel one another and a columnar portion 38 is disposed along the vertical wall portion 34. The columnar portion 38 has the upstanding pin 28 at the tip end.

The ribs 37 each have a low projection portion 37a extending lengthwise along the horizontal wall portion 35 and a high projection portion (rib) 37b intersecting the vertical wall portion 34. The high projection portions 37b follow stepwise the low projection portions 37a. The front end of the columnar portion 38 is positioned in flush with the front ends of the high projection portions 37b.

Figure 10:
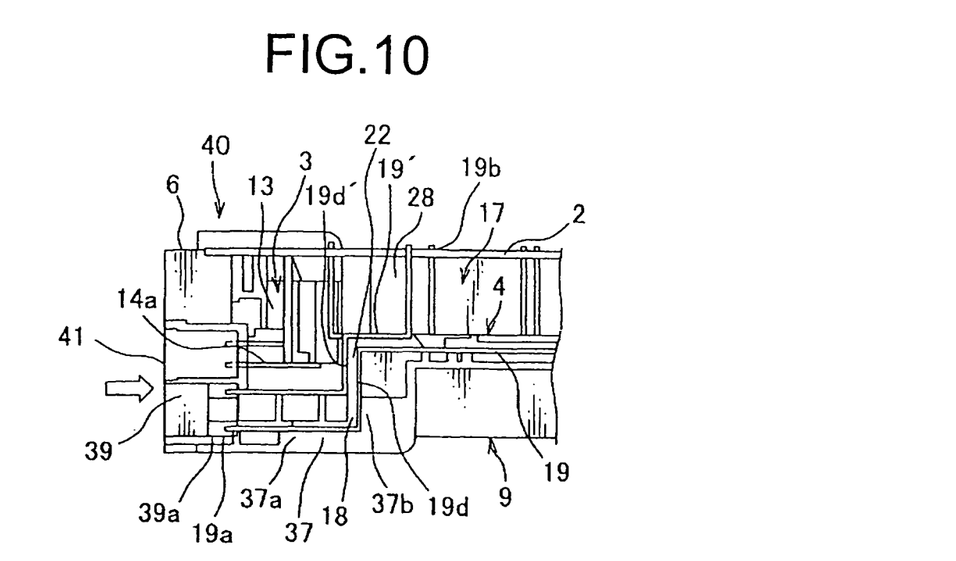
FIG. 10 is a vertical sectional view of the circuit board assembly for high-grade use having the inner cover.
Figure 11:
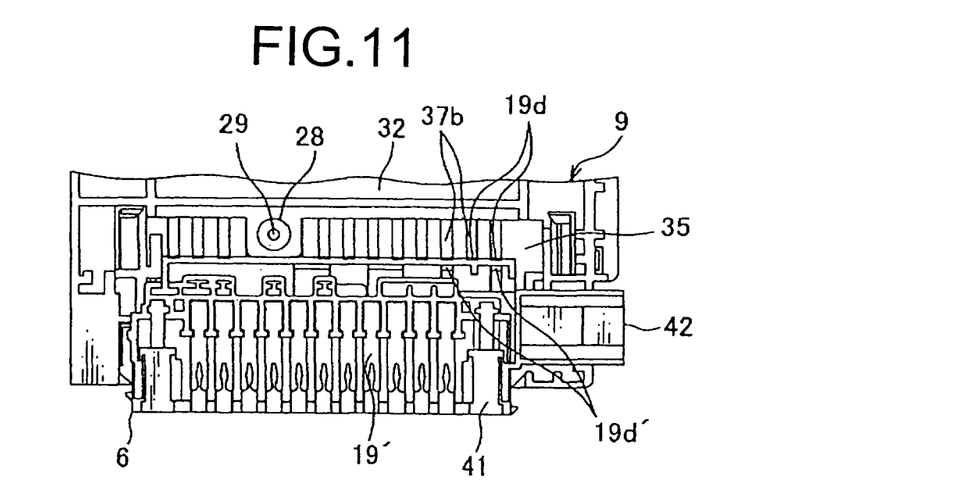
FIG. 11 is a horizontal sectional view of the circuit board assembly for high-grade use having the inner cover.

FIGS. 10-11 show assembling the circuit board assembly 17 (FIG. 3) of high grade vehicles to the inner cover 9.

The rear end surface (rear surface) of the vertical portion (bent portion) 19d of the respective bus bars 19 of the upper layer (sixth layer) of the bus bar block 4 abuts the front end of the high projection portion 37b of the rib 37. Pressing force caused by insertion of fuses 39 is thus accepted with the high projection portions 37b of the ribs 37, and is prevented from being exerted on the solder connection portions 19b between the bus bars 19 and the circuit board 2 so that quality of the solder connection portions is assured.

The bus bars 19 of the upper layer of the present invention are fixed to the block main body 18 with insertion mold. This configuration further assures the quality of connection with the circuit board 2.

The rear end surfaces of the vertical portions 19d' of the bus bars 19' of the lower layer (fifth layer) of the bus bar block 4 abut on the front end surface of the vertical wall portion 22 of the block main body. The insertion force of the fuse is thus accepted with the vertical wall portion 22 and is prevented from being transferred to the circuit board 2. The fifth layer indicates the fifth layer counted from the circuit board 2. The terminals 14 of the terminal block 3 are disposed on the first to the fourth layer.

The fuse holder 6 made of the synthetic resin is attached to the front end portions of the block main body 13, 18 of the lower layer terminal block 3 and the upper layer bus bar block 4, respectively. The fuse block 40 includes the fuse holders 6 each accepting the associated fuse 39 in a cavity (receiving chamber) of the fuse holder 6. In the specification, the lower layer indicates the side near to the circuit board 2.

The bus bars 19 of the upper layer (sixth layer) of the bus bar block 4 abut on the low projection portions 37a of the ribs 37 and are supported integrally with the bus bar block 4. The high projection portions 37b of the ribs 37 prevent in company with the low projection portions 37b the stress from being exerted on the bus bars 19 when the fuses are inserted. The low projection portions 37a prevent bending (flexure) of the bus bars 19 in the direction of thickness thereof. The upper layer bus bars 19 can be separated from the outer surface (upper surface) of the inner cover 9 with the low projection portions 37a so that the insulation is assured. Pairs of an upper and a lower tab terminal 39a of the fuses 39 are each press connected to the pinch terminal portions 19a of the associated bus bar 19. The terminals 14a of the terminal block 3 are connected to fuses 39' of a first and a second layer.

When the bus bar block 4 is not utilized in the circuit board assembly 12 in FIG. 10, the assembly 12 has a vacant space at the bus bar block 4. The fuse holder 6 is commonly used for the low-grade and high-grade vehicles. Fuses 41 at both sides of the fuse holder 6 in FIG. 11 are box-shaped fusible links and are connected to the tab terminal portions instead of the pinch terminal portions 14a of the terminals 14. The reference numeral 42 indicates the power supply connector connected to the terminal block 3 or the fuse holder 6.

Figure 12:
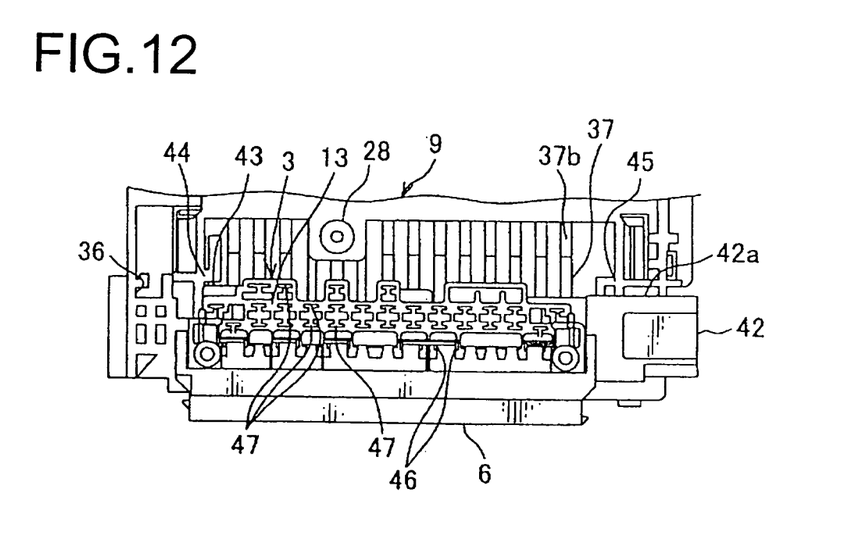
FIG. 12 is a plan view of the inner cover having a terminal block for low-grade vehicles.
Figure 13:
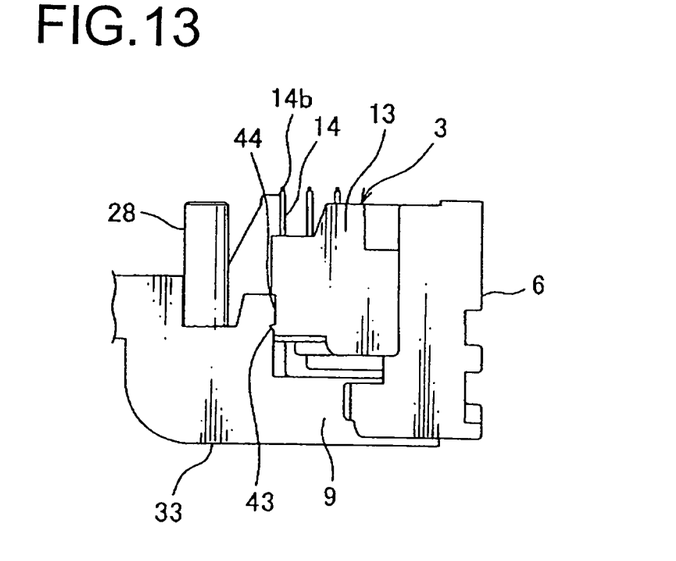
FIG. 13 is a sectional view of the inner cover having the terminal block for low-grade vehicles.

FIGS. 12-13 show the fuse block adapted for the low-grade vehicles, which does not include the bus bar block 4 for high-grade use (FIG. 10). The vertical rear wall surface of the block main body (holder) 13 of the terminal block 3 includes a projection (rib) 43 at the left end side. A rib 44 to be abutted on the projection 43 is disposed on the inner cover 9 and separated from the rib 37 (FIG. 10) for abutting the bus bar block. The rib 44 is bent in L-shape and connected to the side wall portion 36 of the extending portion 33 of the inner cover 8. A rib 45 for abutting on a rear end surface 42a of a housing of the connector 42 integral with the fuse holder 6 is disposed on the right end side of the inner cover 9.

Abutting the terminal block main body 13 on the rib (at least rib 44) ensures acceptance of fuse insertion force with the rib 44 for the low-grade specification. Rearward inclination of the terminal block 3 or an excessive load of stress on the solder connection between the terminals 14 and the circuit board 2 caused by the inclination are prevented so that the quality of the solder connection portion is maintained.

As shown in FIG. 12, the terminal block main body 13 includes a plurality of grooves 46 and a plurality of through holes 47 in the direction of height. The grooves 46 and the through holes 47 are multi-layered (four layers in the embodiment) back and forth and disposed parallel left and right so that the vertical portions of the terminals 14 are insert held with the grooves 46 and the through holes 47. Rear surfaces of the vertical portions of the terminals 14 abut on rear surfaces of the grooves 46 and the trough holes 47 to accept the insertion force of the fuses 39'. Accordingly, the above arrangement accepts the insertion force of the fuses 39' by supporting the block main body 13 with the rib 44.

In the above embodiment, the circuit board 2 is fixed with the screw (screw member) 31 screwed together with the screw hole 29 of the pin 28 of the inner cover 9. The circuit board 2 can be fixed with a nut (screw member) and a male screw disposed on the tip of the pin 28 instead of the screw 31.

INDUSTRIAL APPLICABILITY

The present invention provides a single kind of junction block adapted for several grades of vehicles having different number of power supply circuits without changing number of layers of fuse block.

The present invention provides a single junction block commonly adapted for a low-grade and a high-grade vehicle with a selection of a bus bar block. A conventional junction block is manufactured corresponding to the grade of the vehicle. The present invention thus largely reduces the manufacturing cost.

According to the present invention, three parts of a cover, a bus bar block and a circuit board are positioned each other. A bus bar of the bus bar block for high-grade vehicles can be correctly positioned and smoothly connected to the circuit board. This arrangement improves efficiency of assembly of the three parts and increases reliability of electrical connection of the bus bar to the circuit board.

According to the invention, when a terminal or the bus bar has the same number of layers as the conventional junction block, it is not necessary to use a high-heat resistance resin for the bus bar block and the fuse block can be thus manufactured with low cost.

According to the invention, abutment of the bus bar of the bus bar block on a rib of a cover prevents transmission of an excess stress on the circuit board and maintains quality of a connection portion between the bus bar and the circuit board.

According to the invention, a low projection portion and a high projection portion of the rib cooperatively prevent load of the stress on the bus bar during insertion of the fuse.

According to the invention, abutment of a block main body of the terminal block on the rib of the cover during the insertion of the fuse prevents transmission of the excess stress to the circuit board and thus maintains quality of the connection portion between the terminal and the circuit board. The high-grade junction block further assuredly exhibits the above effects.

The invention claimed is:

1. A junction block comprising:
   a circuit board;
   a terminal block formed by
      a plurality of terminals having one terminal portion to be connected to the circuit board by soldering and another terminal portion to be connected to a fuse, and
      an insulating first block main body receiving the plurality of terminals, wherein
      the insulating first block main body is mounted on one surface of the circuit board;
   a bus bar block formed by
      an insulating second block main body to be superposed on a top surface of the first block main body of the terminal block and
      a plurality of bus bars having one terminal portion to be connected to the circuit board by soldering and another terminal portion to be connected to the fuse, wherein
      the plurality of bus bars is received in the second block main body;
   a cover for covering the circuit board from side of the bus bar block; and a plurality of fuses to be connected to the another terminal portions of the terminal block and the bus bar block, wherein the junction block is adaptable for use with or without use of the bus bar block.

2. The junction block as claimed in claim 1, wherein the bus bar block includes the second block main body having a hole, the cover having a pin engaging the hole, the circuit board having a small hole allowing the pin to be screwed with a screw member.

3. The junction block as claimed in claim 2, wherein the first block main body of the terminal block is made of a high-heat resistance resin and the second block main body of the bus bar block is made of a low-heat resistance resin.

4. The junction block as claimed in claim 1, wherein the cover comprises a rib for allowing abutment of a rear surface of a bent portion of a bus bar of the bus bar block.

5. The junction block as claimed in claim 4, wherein the rib has stepwise a low projection portion and a high projection portion, the low projection portion supporting the bus bar, and the high projection portion abutting the rear surface of the bent portion.

6. The junction block as claimed in claim 1, wherein terminals of the terminal portions are inserted in and held with the first block main body of the terminal block, the cover having a rib for allowing abutment of a rear surface of the first block main body of the terminal block.

7. The junction block as claimed in claim 2, wherein the cover comprises a rib for allowing abutment of a rear surface of a bent portion of a bus bar of the bus bar block, the rib being arranged to be subjected to an insertion force of the fuses.

8. The junction block as claimed in claim 3, wherein the cover comprises a rib for allowing abutment of a rear surface of a bent portion of a bus bar of the bus bar block, the rib being arranged to be subjected to an insertion force of the fuses.

9. The junction block as claimed in claim 7, wherein the rib has stepwise a low projection portion and a high projection portion, the low projection portion supporting the bus bar, and the high projection portion abutting the rear surface of the bent portion.

10. The junction block as claimed in claim 8, wherein the rib has stepwise a low projection portion and a high projection portion, the low projection portion supporting the bus bar, and the high projection portion abutting the rear surface of the bent portion.

11. The junction block as claimed in claim 2, wherein terminals of the terminal portions are inserted in and held with the first block main body of the terminal block, the cover having a rib for allowing abutment of a rear surface of the first block main body of the terminal block.

12. The junction block as claimed in claim 3, wherein terminals of the terminal portions are inserted in and held with the first block main body of the terminal block, the cover having a rib for allowing abutment of a rear surface of the first block main body of the terminal block.

13. The junction block as claimed in claim 4, wherein terminals of the terminal portions are inserted in and held with the first block main body of the terminal block, the cover having a rib for allowing abutment of a rear surface of the first block main body of the terminal block.

14. The junction block as claimed in claim 5, wherein terminals of the terminal portions are inserted in and held with the first block main body of the terminal block, the cover having a rib for allowing abutment of a rear surface of the first block main body of the terminal block.

15. The junction block as claimed in claim 7, wherein terminals of the terminal portions are inserted in and held with the first block main body of the terminal block, the cover having a rib for allowing abutment of a rear surface of the first block main body of the terminal block.

16. The junction block as claimed in claim 8, wherein terminals of the terminal portions are inserted in and held with the first block main body of the terminal block, the cover having a rib for allowing abutment of a rear surface of the first block main body of the terminal block.

17. The junction block as claimed in claim 9, wherein terminals of the terminal portions are inserted in and held with the first block main body of the terminal block, the cover having a rib for allowing abutment of a rear surface of the first block main body of the terminal block.

18. The junction block as claimed in claim 10, wherein terminals of the terminal portions are inserted in and held with the first block main body of the terminal block, the cover having a rib for allowing abutment of a rear surface of the first block main body of the terminal block.

* * * * *